(12) United States Patent
Sato et al.

(10) Patent No.: US 10,414,019 B2
(45) Date of Patent: Sep. 17, 2019

(54) POLISHING COMPOSITION

(71) Applicant: FUJIMI INCORPORATED, Kiyosu-shi, Aichi (JP)

(72) Inventors: Takeki Sato, Kiyosu (JP); Yukinobu Yoshizaki, Kiyosu (JP); Shogo Onishi, Kiyosu (JP)

(73) Assignee: FUJIMI INCORPORATED (JP)

( * ) Notice: Subject to any disclaimer, the term of this patent is extended or adjusted under 35 U.S.C. 154(b) by 0 days.

(21) Appl. No.: 15/764,271

(22) PCT Filed: Sep. 21, 2016

(86) PCT No.: PCT/JP2016/077905
§ 371 (c)(1),
(2) Date: Mar. 28, 2018

(87) PCT Pub. No.: WO2017/057155
PCT Pub. Date: Apr. 6, 2017

(65) Prior Publication Data
US 2018/0290262 A1    Oct. 11, 2018

(30) Foreign Application Priority Data

Sep. 30, 2015  (JP) ................................ 2015-192418
Sep. 30, 2015  (JP) ................................ 2015-192420
Sep. 30, 2015  (JP) ................................ 2015-192421

(51) Int. Cl.
| | |
|---|---|
| *B24B 37/04* | (2012.01) |
| *C09G 1/02* | (2006.01) |
| *C09K 3/14* | (2006.01) |
| *H01L 21/306* | (2006.01) |
| *H01L 21/3105* | (2006.01) |
| *H01L 21/321* | (2006.01) |

(52) U.S. Cl.
CPC .............. *B24B 37/044* (2013.01); *C09G 1/02* (2013.01); *C09K 3/1436* (2013.01); *C09K 3/1463* (2013.01); *H01L 21/30625* (2013.01); *H01L 21/31053* (2013.01); *H01L 21/31055* (2013.01); *H01L 21/31058* (2013.01); *H01L 21/3212* (2013.01)

(58) Field of Classification Search
USPC .......................................... 451/28; 438/692
See application file for complete search history.

(56) References Cited

U.S. PATENT DOCUMENTS

| | | |
|---|---|---|
| 2012/0129346 A1 | 5/2012 | Ryuzaki et al. |
| 2013/0146804 A1 | 6/2013 | Mizuno et al. |
| 2015/0299517 A1 | 11/2015 | Matsushita et al. |
| 2017/0175053 A1 | 6/2017 | Yokota et al. |

FOREIGN PATENT DOCUMENTS

| | | |
|---|---|---|
| JP | 2012-040671 A | 3/2012 |
| JP | 2012-084906 A | 4/2012 |
| JP | 2014-118490 A | 6/2014 |
| KR | 1020140125049 A | 10/2014 |
| TW | 201536903 A | 10/2015 |
| WO | 2014/084091 A1 | 6/2014 |

OTHER PUBLICATIONS

First Office Action for Chinese Patent Application No. 2018100902383080 dated Oct. 12, 2018.
International Search Report for International Application No. PCT/JP2016/077905 dated Dec. 6, 2016.
Written Opinion of the International Searching Authority for International Application No. PCT/JP2016/077905 dated Dec. 6, 2016.
English translation of the International Preliminary Report on Patentability for International Application No. PCT/JP2016/077905 dated Apr. 12, 2018.
Office Action for Korean Patent Application No. 10-2018-7007721 dated Aug. 1, 2018.

*Primary Examiner* — Robert P Culbert
(74) *Attorney, Agent, or Firm* — Katten Muchin Rosenman LLP

(57) ABSTRACT

An object of the present invention is to provide a polishing composition enabling polishing of an object to be polished at higher speed.
Provided is a polishing composition used for polishing an object to be polished in which the polishing composition contains surface-modified abrasive grains, in which an ionic dispersant is directly modified on the surface of the abrasive grains, and dispersing medium, and aggregation of the abrasive grains is suppressed in the dispersing medium.

11 Claims, No Drawings

POLISHING COMPOSITION

TECHNICAL FIELD

The present invention relates to a polishing composition.

BACKGROUND ART

In recent years, a new fine processing technology has been developed in accordance with high integration and high performance of large scale integration (LSI). A chemical mechanical polishing (CMP) method is one of those technologies, and it is often used in an LSI manufacturing process, particularly in planarizing an interlayer insulating film in a multilayer wiring forming process, forming a metal plug, and forming embedded wiring (damascene wiring).

The CMP has been applied to each step for manufacturing a semiconductor, and, as one example of the applications, an application to a gate forming step for manufacturing a transistor can be mentioned, for example. For manufacturing a transistor, there may be a case in which materials such as metal, silicon, silicon oxide, polycrystalline silicon (polysilicon), and silicon nitride are polished, and there is need for polishing each material at high speed to enhance the productivity.

In order to meet those needs, there is a technique in which an improvement is made for the abrasive grains to be contained in a polishing composition (Patent Literature 1). The abrasive grain to be contained in the polishing composition, which is disclosed in Patent Literature 1, is colloidal silica that is immobilized with an organic acid like sulfonic acid and carbonic acid. It is described that, as the abrasive grains are contained in the polishing composition, the object to be polished described in the same literature is polished at high speed.

CITATION LIST

Patent Literatures

Patent Literature 1: JP 2012-40671 A

SUMMARY OF INVENTION

Technical Problem

It is certainly shown in Patent Literature 1 that, compared to the use of common colloidal silica which is not immobilized with an organic acid, the object to be polished can be polished at higher speed.

However, there is need for having the polishing at even higher speed depending on a case, and, from the viewpoint of responding to such need, margin for improvement exists in Patent Literature 1.

Accordingly, an object of the present invention is to provide a polishing composition enabling polishing of an object to be polished at higher speed.

Solution to Problem

The inventors repeated intensive studies to solve the problem that is described above. As a result, the inventors found that the above-described problem is solved by a polishing composition used for polishing an object to be polished, the polishing composition including surface-modified abrasive grains in which an ionic dispersant is directly modified on a surface of the abrasive grains; and a dispersing medium, wherein, in the dispersing medium, aggregation of the abrasive grains is suppressed.

Advantageous Effects of Invention

According to the present invention, a polishing composition enabling polishing of an object to be polished at higher speed can be provided.

DESCRIPTION OF EMBODIMENTS

Hereinbelow, the present invention is explained. Incidentally, the present invention is not limited to the following embodiments. Furthermore, in the present specification, the expression "X to Y" indicating a range means "X or more and Y or less". Furthermore, unless specifically described otherwise, operations and measurements of a physical property or the like are carried out at conditions including room temperature (20 to 25° C.)/relative humidity of 40 to 50% RH.

The present invention relates to a polishing composition used for polishing an object to be polished, the polishing composition containing surface-modified abrasive grains in which an ionic dispersant is directly modified on the surface of the abrasive grains; and a dispersing medium, in which, in the dispersing medium, aggregation of the abrasive grains is suppressed.

According to the above constitution, not only an object to be polished can be polished at higher speed compared to the case of using common colloidal silica that is not immobilized with an organic acid, but also an object to be polished can be polished at even higher speed compared to the case of using colloidal silica that is immobilized with an organic acid.

<Object to be Polished>

First, descriptions are given for the object to be polished according to the present invention.

In the present invention, type of the object to be polished is not particularly limited. However, according to a preferred embodiment of the present invention, the object to be polished is an object to be polished which has a silicon-oxygen bond, an object to be polished which has a silicon-silicon bond, or an object to be polished which has a silicon-nitrogen bond.

Examples of the object to be polished which has a silicon-oxygen bond include silicon oxide film, black diamond (BD: SiOCH), fluorosilicate glass (FSG), hydrogen silsesquioxane (HSQ), CYCLOTENE, SiLK, and methyl silsesquioxane (MSQ).

Examples of the object to be polished which has a silicon-silicon bond include polysilicon, amorphous silicon, monocrystalline silicon, n type dope monocrystalline silicon, p type dope monocrystalline silicon, and Si-based alloy like SiGe.

Examples of the object to be polished which has a silicon-nitrogen bond include silicon nitride film and SiCN (silicon carbonitride).

Among them, from the viewpoint of enhancing the polishing speed and from the viewpoint of a universal use property of the material itself, an object to be polished which has a silicon-oxygen bond is particularly preferable.

<Polishing Composition>

Next, descriptions are given for the polishing composition.

The polishing composition of the present invention contains surface-modified abrasive grains in which an ionic dispersant is directly modified on the surface of the abrasive grains, a dispersing medium, and other components, if necessary.

[Surface-Modified Abrasive Grains in which Ionic Dispersant is Directly Modified on Surface of Abrasive Grains]

As described in the above, in the polishing composition of the present invention, surface-modified abrasive grains in which an ionic dispersant is directly modified on the surface of the abrasive grains (in the present specification, it is also simply referred to as "surface-modified abrasive grains") are contained. By containing the surface-modified abrasive grains in the polishing composition and polishing an object to be polished with the composition, it is possible that, not only the object to be polished can be polished at higher speed compared to the case of using common colloidal silica that is not immobilized with an organic acid, but also an object to be polished can be polished at even higher speed compared to the case of using colloidal silica that is immobilized with an organic acid.

(Abrasive Grains)

Examples of the type of the abrasive grains that are directly modified with an ionic dispersant and used for the polishing composition according to the present invention include metal oxide such as silica, alumina, zirconia, or titania. The abrasive grains may be used either singly or in combination of two or more types. As for the abrasive grains, a commercially available product or a synthesized product may be used.

Preferred type of the abrasive grains is silica, and more preferred type is colloidal silica. Examples of the method for producing colloidal silica include a soda silicate method and a sol-gel method. Colloidal silica produced by any one of those methods can be suitably used as the abrasive grains of the present invention. However, from the viewpoint of reducing metal impurities, colloidal silica produced by a sol-gel method allowing production with high purity is preferable.

Furthermore, with regard to the descriptions given regarding average primary particle size, average secondary particle size, or D90/D10 of the "abrasive grains", the descriptions given for the "surface-modified abrasive grains" to be described below are basically also applicable.

(Ionic Dispersant)

The ionic dispersant means an agent which has a functional group to be ionized in a dispersing medium (liquid temperature: 25° C.), and it is preferably a polymer having an ionizing functional group.

Examples of the ionic dispersant which is directly modified on surfaces of the abrasive grains include polycarbonic acid or a derivative thereof, polyamine or a derivative thereof, a quaternary ammonium-based polymer, and polyvinyl alcohol (PVA) or a derivative thereof.

Examples of the polycarbonic acid derivative include polycarbonic acid ester, polycarbonic acid anhydride, polycarbonic acid amine salt, polycarbonic acid ammonium salt, and polycarbonic acid sodium salt. Examples of the polycarbonic acid ester include those having an aliphatic hydrocarbon or an aromatic hydrocarbon in the ester residue. Furthermore, as for the polycarbonic acid or a derivative thereof, it is preferable to use polyacrylic acid or a derivative thereof. Examples of the polyacrylic acid or a derivative thereof include polyacrylic acid, polyacrylic acid ester, polyacrylic acid anhydride, polyacrylic acid amine salt, polyacrylic acid ammonium salt, and polyacrylic acid sodium salt.

Specific examples of the polyvinyl alcohol (PVA) derivative include an anion-modified PVA derivative such as carbonic acid-modified PVA, undecylenic acid-modified PVA, or sulfonic acid-modified PVA; and a cation-modified PVA derivative such as ammonium-modified PVA, sulfonium-modified PVA, and amino group-modified PVA. Thus, according to a preferred embodiment of the present invention, the ionic dispersant is polyvinyl alcohol or a derivative thereof, and according to a preferred embodiment of the present invention, the polyvinyl alcohol or a derivative thereof is a cation-modified polyvinyl alcohol or a derivative thereof.

The ionic dispersant may be used either singly or in combination of two or more types. Furthermore, as for the ionic dispersant, a commercially available product or a synthesized product may be used.

Examples of the commercially available product of an ionic dispersant include SN Dispersant 5027, 5468, 4215 (all manufactured by SAN NOPCO LIMITED); GOHSENX T Series (T-350, T-330H or the like), GOHSENX L Series (L-3266 or the like), GOHSENX K Series (K-434 or the like) (all manufactured by The Nippon Synthetic Chemical Industry Co., Ltd.), and K Polymer Series (KL-506, KL-318, KL-118, KM-618, KM-118 or the like) and C polymer Series (C-506, CM-318 or the like) (all manufactured by KURARAY CO., LTD.). However, the ionic dispersant is not limited to them, and various ionic dispersants can be used.

Furthermore, in the present invention, number average molecular weight of the ionic dispersant which is used for surface modification of the abrasive grains is, although not particularly limited, preferably 1000 to 50000, more preferably 1500 to 25000, and even more preferably 2000 to 15000 from the viewpoint of the dispersion stability. Furthermore, the method for measuring the number average molecular weight is based on the method of Examples.

(Method for Producing Surface-Modified Abrasive Grains)

Method for producing the surface-modified abrasive grains is not particularly limited as long as it is a method by which an ionic dispersant is directly modified on surfaces of the abrasive grains. However, suitable methods are those that are described below.

Namely, the method for producing the surface-modified abrasive grains includes (1) a first step of preparing an abrasive grain dispersion liquid containing the aforementioned abrasive grains; (2) a second step of adjusting the abrasive grain dispersion liquid to have pH of from 7 to 9 to produce a pH adjusted dispersion liquid, and (3) a third step of mixing the pH adjusted dispersion liquid with the ionic dispersant.

Accordingly, the surface-modified abrasive grains can be produced conveniently.

Furthermore, according to the method for directly modifying an ionic dispersant on surfaces of the abrasive grains, abrasive grains with modified surfaces can be conveniently produced compared to a conventionally known immobilization of an organic acid onto abrasive grains. More specifically, the followings are known as the surface modification of abrasive grains using an organic acid. For example, in the case of immobilization of sulfonic acid, which is one type of an organic acid, onto colloidal silica, the immobilization is carried out according to the method described in "Sulfonic acid-functionalized silica through of thiol groups", Chem. Commun. 246-247 (2003), for example. Specifically, after coupling a silane coupling agent having thiol group like 3-mercaptopropyltrimethoxysilane to colloidal silica followed by oxidation of the thiol group with hydrogen peroxide, colloidal silica of which surface is immobilized with sulfonic acid is obtained. Alternatively, in the case of immobilization of carbonic acid, which is also one type of an organic acid, onto colloidal silica, the immobilization is carried out according to the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, after coupling a silane coupling agent containing photoreactive 2-nitrobenzyl ester to colloidal silica followed by illumination with light, colloidal silica of which surface is immobilized with carbonic acid is obtained.

However, as the production of abrasive grains that are immobilized with an organic acid like sulfonic acid and carbonic acid described above has high number of steps, it is disadvantageous from the viewpoint of the productivity. Furthermore, there is a possibility that, as the oxidizing agent used for oxidation of a thiol group remains or the like, unintended polishing of an object to be polished may be yielded. In this regard, the surface-modified abrasive grains of the present invention can be produced with high convenience as described above, and thus it is advantageous from the viewpoint of the productivity.

Hereinbelow, descriptions are given for the method for producing the surface-modified abrasive grains of a preferred embodiment.

[First Step]

The first step is a step of preparing an abrasive grain dispersion liquid containing abrasive grains. In this regard, it is possible to prepare an abrasive grain dispersion liquid in which abrasive grains produced by the aforementioned soda silicate method or sol-gel method are dispersed in a dispersion liquid. Alternatively, a commercially available product may be obtained, if available. In addition, the abrasive grain dispersion liquid is preferably a water dispersion liquid of abrasive grains. In that case, content of the abrasive grains is preferably 1 to 50% by mass, and more preferably 5 to 35% by mass relative to the total mass of the abrasive grain dispersion liquid.

[Second Step]

The second step is a step of adjusting the abrasive grain dispersion liquid to have pH of from 7 to 9. More preferably, the adjustment is made to have pH of from 7.0 to 9.0. Even more preferably, the adjustment is made to have pH of from 7.5 to 8.5.

For adjusting the pH to from 7 to 9, any method can be used. For example, the adjustment can be made by mixing a pH adjusting agent with the abrasive grain dispersion liquid. The adjustment of the pH to from 7 to 9 is carried out for the reason of ensuring the dispersion property of abrasive grains and ensuring the ionic property of an ionic dispersant. The method for mixing is not particularly limited, either. It is preferable that a pH adjusting agent is added to the abrasive grain dispersion liquid. Thus, it is preferable that the polishing composition of the present invention further contains a pH adjusting agent. Furthermore, specific examples of the pH adjusting agent are explained in the followings. Furthermore, the pH value described in the present invention means a value which is measured at the conditions that are described in Examples.

[Third Step]

The third step is a step of mixing the pH adjusted dispersion liquid with the ionic dispersant.

This step is not particularly limited as long as it is a method allowing mixing of the pH adjusted dispersion liquid with the ionic dispersant. It is acceptable that the ionic dispersant is added to the pH adjusted dispersion liquid, and it is also acceptable that the pH adjusted dispersion liquid is added to the ionic dispersant. It is still acceptable that they are combined with each other. The method of adding the ionic dispersant to the pH adjusted dispersion liquid is preferable. Furthermore, the addition speed is not particularly limited, either, and from the viewpoint of suppressing aggregation, the addition speed is preferably 0.1 to 10 g/min, and more preferably 0.5 to 5 g/min, for example.

The addition amount of the ionic dispersant is not particularly limited as long as it is an amount allowing direct modification of an ionic dispersant on the surfaces of abrasive grains. However, from the viewpoint of having more complete modification of a surface of each abrasive grain, the addition amount is preferably 0.0001 to 1 g, more preferably 0.001 to 0.5 g, even more preferably 0.005 to 0.1 g, still even more preferably 0.006 to 0.05 g, and particularly preferably 0.007 to 0.01 g relative to 1 g of the abrasive grains.

Furthermore, the temperature at that time (liquid temperature) is not particularly limited, either. However, from the viewpoint of the absorption and desorption reaction of an ionic dispersant, the temperature is preferably 10 to 60° C., and more preferably 15 to 40° C. Furthermore, during and/or after the addition, stirring is preferably performed. Thus, according to a preferred embodiment of the present invention, the third step is performed by stirring at 10 to 60° C. Furthermore, the stirring speed is not particularly limited, either. However, the stirring speed is preferably 100 to 600 rpm, and more preferably 150 to 500 rpm. By performing the stirring at 10 to 60° C., a technical effect of having easy surface modification with the agent can be obtained.

Furthermore, the time for mixing the pH adjusted dispersion liquid with the ionic dispersant is not particularly limited, either. However, from the viewpoint that the surface-modified abrasive grains are produced more reliably, the mixing time is preferably 5 to 300 minutes, more preferably 10 to 120 minutes, and even more preferably 30 to 80 minutes.

According to the above production method, the surface-modified abrasive grains can be produced conveniently.

The lower limit of the average primary particle size of the surface-modified abrasive grains in the polishing composition is preferably 5 nm or higher, more preferably 7 nm or higher, even more preferably 10 nm or higher, still even more preferably 15 nm or higher, and particularly preferably 25 nm or higher. Furthermore, the upper limit of the average primary particle size of the surface-modified abrasive grains in the polishing composition is preferably 200 nm or lower, more preferably 150 nm or lower, even more preferably 100 nm or lower, still even more preferably 70 nm or lower, still even more preferably 60 nm or lower, and particularly preferably 50 nm or lower.

As the average primary particle size is within the above range, a defect like scratches on a surface of an object to be polished after polishing by using the polishing composition can be suppressed. Furthermore, the average primary particle size of the surface-modified abrasive grains is calculated based on SEM, for example. In Examples of the present invention, the calculation is made similarly.

The lower limit of the average secondary particle size of the surface-modified abrasive grains in the polishing composition is preferably 5 nm or higher, more preferably 7 nm or higher, even more preferably 10 nm or higher, still even more preferably 26 nm or higher, still even more preferably 36 nm or higher, still even more preferably 45 nm or higher, and particularly preferably 55 nm or higher. Furthermore, the upper limit of the average secondary particle size of the surface-modified abrasive grains in the polishing composition is preferably 300 nm or lower, more preferably 260 nm or lower, even more preferably 220 nm or lower, still even more preferably 150 nm or lower, still even more preferably 120 nm or lower, still even more preferably 100 nm or lower, and particularly preferably 80 nm or lower. As the average secondary particle size is within the above range, an occurrence of a surface defect on a surface of an object to be polished after polishing by using the polishing composition can be suppressed more.

Furthermore, the secondary particle described herein indicates a particle that is formed by association of the surface-modified abrasive grains in the polishing composition. The average secondary particle size of the secondary particle can be measured by a dynamic light scattering method, for example. In Examples of the present invention, the calculation is made similarly.

The lower limit of the ratio (in the present specification, it is also simply referred to as "D90/D10") of the diameter D90 of particles when the cumulative particle mass from the fine particle side reaches 90% of the total particle mass to the diameter D10 of particles when the cumulative particle mass from the fine particle side reaches 10% of the total particle mass of the entire particles is preferably 1.1 or more, more preferably 1.2 or more, even more preferably 1.3 or more, and particularly preferably 1.4 or more in the particle size distribution of the surface-modified abrasive grains in the polishing composition, in which the particle size distribution is determined by a laser diffraction scattering method. Furthermore, the upper limit of the ratio D90/D10 is not particularly limited but it is preferably 5.0 or less, more preferably 3.0 or less, even more preferably 2.5 or less, and still even more preferably 2.0 or less. As the ratio is the within this range, an occurrence of a surface defect on a surface of an object to be polished after polishing by using the polishing composition can be suppressed more. A small D90/D10 (close to 1.0) indicates a narrow particle size distribution width, and the increasing value indicates a wider particle size distribution width. In Examples of the present invention, the measurement is made similarly.

The lower limit of the total content (concentration) of the surface-modified abrasive grains in the polishing composition is preferably 0.002% by mass or more, more preferably 0.02% by mass or more, even more preferably 0.1% by mass or more, still even more preferably 1% by mass or more, and particularly preferably 3% by mass or more relative to the total mass of the composition. Furthermore, the upper limit of the total content (concentration) of the surface-modified abrasive grains in the polishing composition is preferably 10% by mass or less, more preferably 8% by mass or less, and particularly preferably 7% by mass or less relative to the total mass of the composition. As the total content is within this range, high polishing speed can be obtained while the cost is suppressed.

<Dispersing Medium>

The polishing composition according to the present invention contains a dispersing medium for dispersing each component. As for the dispersing medium, water is preferable. Water containing impurities as little as possible is preferable from the viewpoint of suppressing the inhibition of the function of other components. Specifically, pure water or ultra-pure water obtained by removing foreign matters through a filter after impurity ions are removed by using an ion exchange resin, or distilled water is preferable.

<Suppression of Aggregation>

The present invention relates to a polishing composition used for polishing an object to be polished in which the polishing composition contains surface-modified abrasive grains, in which an ionic dispersant is directly modified on the surface of the abrasive grains, and a dispersing medium, and, in the dispersing medium, aggregation of the abrasive grains is suppressed. According to the present invention, as the aggregation of the abrasive grains is suppressed in the dispersing medium, the object to be polished can be polished at high speed.

In the present invention, in order for the surface-modified abrasive grains to have a structure in which surfaces of the abrasive grains are directly modified with an ionic dispersant, aggregation of the abrasive grains is suppressed in the dispersing medium. On the other hand, with regard to dispersing the abrasive grains in the dispersing medium, if surfaces of the abrasive grains are not suitably modified with an ionic dispersant, the abrasive grains are quickly aggregated in the dispersing medium, resulting in larger secondary particle size or, depending on a case, an excessive increase of precipitating abrasive grains is caused.

The degree of "aggregation of the abrasive grains is suppressed in the dispersing medium" as described in the present invention is not particularly limited. However, the change ratio between the average secondary particle size of the abrasive grains in an abrasive grain dispersion liquid (that is, abrasive grains before direct surface modification with an ionic dispersant) and the average secondary particle size of the surface-modified abrasive grains that are dispersed in a dispersing medium in the polishing composition is, when the former is referred to as before the change and the latter is referred to as after the change, preferably 10% or less, more preferably 6% or less, even more preferably 4% or less, and particularly preferably 2% or less. Furthermore, each of the average secondary particle size of the abrasive grains and the surface-modified abrasive grains can be calculated according to the method described above.

According to Examples of the present invention, before the change is 60 nm and after the change is 58.7 to 60.8 nm, and thus they are within the aforementioned range. That the change ratio is significantly low means that the dispersion state of the abrasive grains in the abrasive grain dispersion liquid is still maintained almost at the same level in the polishing composition.

<Other Components>

The polishing composition according to the present invention may further contain other components such as a pH adjusting agent, an oxidizing agent, a metal anticorrosive agent, an antiseptic agent, an antifungal agent, a water soluble polymer, and an organic solvent for dissolving a sparingly soluble organic substance, if necessary. Hereinbelow, descriptions are given for a pH adjusting agent, an oxidizing agent, a metal anticorrosive agent, an antiseptic agent, and an antifungal agent, which are the preferred other components.

[pH Adjusting Agent]

According to a preferred embodiment of the present invention, pH of the polishing composition is preferably within an acidic region, although the pH is not particularly limited. Herein, the acidic region described in the present invention means pH of less than 7, and it is preferably pH of from 2 to 5. More preferably, it is pH of from 2.0 to 5.0. Even more preferably, it is pH of from 2.1 to 3.0. As the pH is within this range, stability of the ionic dispersant can be enhanced, and unintended decomposition of the ionic dispersant can be suppressed. Furthermore, the object to be polished can be polished at high speed. The neutral range described in the present invention means pH 7. Furthermore, the basic range described in the present invention means pH of more than 7, and it is preferably pH of from 8 to 13.

Furthermore, the pH value described in the present invention means a value that is measured at the conditions that are described in Examples.

In the case of adjusting the pH, it is preferable to use a pH adjusting agent. Thus, according to a preferred embodiment of the present invention, the polishing composition further contains a pH adjusting agent.

As for the pH adjusting agent, any of known acid, base, or a salt thereof can be used. Specific examples of the acid which may be used as a pH adjusting agent include an inorganic acid such as hydrochloric acid, sulfuric acid, nitric acid, fluoric acid, boric acid, carbonic acid, hypophosphorous acid, phosphorous acid, or phosphoric acid; and an organic acid such as formic acid, acetic acid, propionic acid, butyric acid, pentanoic acid, 2-methylbutyric acid, hexanoic acid, 3,3-dimethylbutyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarbonic acid, 2,5-furandicarbonic acid, 3-furancarbonic acid, 2-tetrahydrofurancarbonic acid, methoxyacetic acid, methoxyphenylacetic acid, or phenoxyacetic acid. When an inorganic acid is used as a pH adjusting agent, sulfuric acid, nitric acid, phosphoric acid, and the like are particularly preferable from the viewpoint of enhancing the polishing speed. When an organic acid is used as a pH adjusting agent, glycolic acid, succinic acid, maleic acid, citric acid, tartaric acid, malic acid, gluconic acid, itaconic acid, and the like are particularly preferable from the viewpoint of enhancing the polishing speed.

Examples of the base which may be used as a pH adjusting agent include an amine such as aliphatic amine or aromatic amine, an organic base such as quaternary ammonium hydroxide, hydroxide of an alkali metal such as potassium hydroxide, hydroxide of an element of Group II, and ammonia.

Among those pH adjusting agents, nitric acid, potassium hydroxide, phosphoric acid, sulfuric acid, maleic acid, and sodium hydroxide are more preferable from the viewpoint of easy availability and enhancement of polishing speed.

The pH adjusting agent may be used either singly or in combination of two or more types thereof. The addition amount of the pH adjusting agent is not particularly limited, and it is suitably adjusted so that the polishing composition can have a desired pH.

[Oxidizing Agent]

The oxidizing agent which may be added to the polishing composition has a function of oxidizing a surface of an object to be polished and it can enhance the polishing speed of the polishing composition for an object to be polished.

Examples of the oxidizing agent which may be used include hydrogen peroxide, sodium peroxide, barium peroxide, ozone water, silver (II) salt, iron (III) salt, permanganese acid, chromic acid, dichromatic acid, peroxodisulfuric acid, peroxophosphoric acid, peroxosulfuric acid, peroxoboric acid, performic acid, peracetic acid, perbenzoic acid, perphthalic acid, hypochlorous acid, hypobromic acid, hypoiodic acid, chloric acid, chlorous acid, perchloric acid, bromic acid, iodic acid, periodic acid, persulfuric acid, dichloroisocyanuric acid, and a salt thereof. The oxidizing agent may be used either singly or as a mixture of two or more types thereof.

Content of the oxidizing agent in the polishing composition is preferably 0.1 g/L or more, more preferably 1 g/L or more, and even more preferably 3 g/L or more. As the content of the oxidizing agent increases, the polishing speed of the polishing composition for an object to be polished is further enhanced.

Furthermore, content of the oxidizing agent in the polishing composition is preferably 200 g/L or less, more preferably 100 g/L or less, and even more preferably 40 g/L or less. As the content of the oxidizing agent decreases, the material cost of the polishing composition can be saved and a load involved with treatment of the polishing composition after use, that is, a load involved with waste water treatment, can be reduced. It is also possible to lower the possibility of having excessive oxidation of a surface of an object to be polished by an oxidizing agent.

[Metal Anticorrosive Agent]

By adding a metal anticorrosive agent to the polishing composition, it is possible to further suppress generation of a recess on a side of the wiring by polishing using the polishing composition. In addition, it is possible to further suppress an occurrence of dishing on the surface of the object to be polished after the object to be polished is polished using the polishing composition.

The metal anticorrosive agent which can be used is not particularly limited, but is preferably a heterocyclic compound or a surfactant. The number of members of the heterocyclic ring in the heterocyclic compound is not particularly limited. Furthermore, the heterocyclic compound may be a monocyclic compound or a polycyclic compound having a condensed ring. The metal anticorrosive agent may be used either singly or as a mixture of two or more kinds thereof. As the metal anticorrosive agent, a commercially available product or a synthetic product may be used.

Specific examples of the heterocyclic compound which can be used as a metal anticorrosive agent include a nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buteridin compound, a thiazole compound, an isothiazole compound, an oxazole compound, an isoxazole compound, and a furazan compound.

[Antiseptic Agent and Antifungal Agent]

Examples of the antiseptic agent and antifungal agent that are used in the present invention include an isothiazoline-based antiseptic agent such as 2-methyl-4-isothiazolin-3-one or 5-chloro-2-methyl-4-isothiazolin-3-one, paraoxybenzoate ester, and phenoxyethanol, and the like. These antiseptic agents and antifungal agents may be used either singly or as a mixture of two or more kinds thereof.

Furthermore, according to a preferred embodiment of the present invention, the polishing speed for an object to be polished is preferably higher than 188 [Å/min]. It is more preferably 200 [Å/min] or higher, even more preferably 240 [Å/min] or higher, and still even more preferably 500 [Å/min] or higher.

<Method for Producing Polishing Composition>

In the present invention, provided is a method for producing a polishing composition used for polishing an object to be polished, the method including mixing surface-modified abrasive grains in which an ionic dispersant is directly modified on the surface of the abrasive grains with a dispersing medium. According to this method, the polishing composition of the present invention can be produced with good efficiency.

Furthermore, with regard to the "surface-modified abrasive grains in which an ionic dispersant is directly modified on the surface of the abrasive grains" and "dispersing medium", the descriptions that are given above are also applied.

The method for mixing described above is not particularly limited, and for example, it is sufficient that the method is carried out by stirring and mixing the surface-modified abrasive grains in which an ionic dispersant is directly modified on the surface of the abrasive grains and, if necessary, other components in the dispersing medium. Furthermore, when the surface-modified abrasive grains are prepared in advance, the order for adding the grains relative to other components is not particularly limited, and the polishing composition can be produced in a state in which aggregation of the abrasive grains is suppressed.

The temperature at the time of mixing each component is not particularly limited, but it is preferably from 10 to 40° C. Heating may be performed in order to increase the rate of dissolution. The mixing time is not particularly limited, either.

<Polishing Method>

In the present invention, provided is a polishing method for polishing an object to be polished by using the polishing composition described above or using the polishing composition obtained by the method for producing the polishing composition described above.

As a polishing apparatus, it is possible to use a general polishing apparatus provided with a holder for holding a substrate or the like having an object to be polished, a motor or the like having a changeable rotation speed, and a polishing plate to which a polishing pad (polishing cloth) can be attached.

As the polishing pad, common nonwoven fabric, polyurethane, porous fluororesin, or the like can be used without any particular limitation. The polishing pad is preferably groove-processed such that a polishing liquid can be stored therein.

Polishing conditions are not particularly limited, either. For example, the rotation speed of the polishing plate and head is preferably from 10 to 500 rpm independently, and the pressure applied to a substrate having an object to be polished (polishing pressure) is preferably from 0.5 to 10 psi. A method for supplying the polishing composition to a polishing pad is not particularly limited, either. For example, a method in which the polishing composition is supplied continuously using a pump or the like can be employed. The supply amount is not limited, but a surface of the polishing pad is preferably covered all the time with the polishing composition of the present invention.

The polishing composition of the present invention can be either a single liquid type or a multi liquid type including a two liquid type in which part or all of the polishing composition is mixed at any mixing ratio. Furthermore, when a polishing apparatus having plural pathways for supplying the polishing composition is used, it is also possible to use two or more kinds of the previously prepared polishing composition such that the polishing compositions are mixed on a polishing apparatus.

Furthermore, the polishing composition of the present invention can be in the form of a stock solution, or it can be prepared by diluting the stock solution of the polishing composition with water. When the polishing composition is a two liquid type, the order for mixing and dilution can be any order. For example, it is possible that one composition is diluted with water followed by mixing of the compositions, the compositions are diluted with water simultaneously with mixing, or the mixed polishing compositions are diluted with water.

EXAMPLES

The present invention will be further described in detail with the following Examples and Comparative examples. However, the technical scope of the present invention is not limited to the following Examples. Furthermore, unless specifically described otherwise, "%" and "parts" indicate "% bymass" and "parts by mass", respectively. Furthermore, unless specifically described otherwise, operations of the following Examples were carried out at conditions including room temperature (25° C.)/relative humidity of 40 to 50% RH.

Example 1

By adding the additive shown in Table 1 to abrasive grains (colloidal silica; average primary particle size: 30 nm, average secondary particle size: 60 nm, D90/D10: 2.01), surface-modified abrasive grains in which an ionic dispersant was directly modified on the surface of the abrasive grains were produced.

More specifically, 3000 g of an aqueous dispersion liquid of abrasive grains (abrasive grains 20% by weight) in which the above abrasive grains were dispersed were prepared. Subsequently, by adding a pH adjusting agent (maleic acid) to the aqueous dispersion liquid of abrasive grains, an aqueous dispersion liquid of abrasive grains with pH 8.0 was prepared to give a pH adjusted dispersion liquid. After that, while performing stirring at 250 rpm by using a table top stirrer, the additive shown in Table 1 (ionic dispersant) was added at speed of 1 g/min and liquid temperature of 25° C. for 5 minutes to the pH adjusted dispersion liquid. While maintaining the liquid temperature of 25° C., the stirring state was maintained for 1 hour to produce the surface-modified abrasive grains in which an ionic dispersant was directly modified on the surface of the abrasive grains.

After that, by mixing the surface-modified abrasive grains produced above with maleic acid as a pH adjusting agent in a dispersing medium (pure water) such that concentration of the surface-modified abrasive grains is 5% by mass and pH is 2.1, a polishing composition was prepared (mixing temperature: about 25° C., mixing time: about 10 minutes). Furthermore, the order for mixing the surface-modified abrasive grains with other components like pH adjusting agent is not limited.

Furthermore, pH of the polishing composition (liquid temperature: 25° C.) was determined by a pH meter (LAQUA, manufactured by HORIBA, Ltd.).

Furthermore, as for the number average molecular weight (Mn) of the additive shown in Table 1, a value measured by GPC (gel permeation chromatography) with polystyrene calibration was adopted.

Examples 2 to 5

The polishing composition was produced in the same manner as Example 1 except that the type and number average molecular weight of the additive were changed as shown in Table 1.

Comparative Example 1

The polishing composition was produced in the same manner as Example 1 except that the surface-modified abrasive grains were changed to abrasive grains in which sulfonic acid was immobilized on the surface of the grains.

Comparative Example 2

The polishing composition was produced in the same manner as Example 1 except that the additive was not used.

Comparative Example 3

The polishing composition was produced in the same manner as Example 1 except that the abrasive grains, additive, and pH adjusting agent were simultaneously mixed with a dispersing medium.

Comparative Example 4

The polishing composition was produced in the same manner as Example 4 except that the abrasive grains, additive, and pH adjusting agent were simultaneously mixed with a dispersing medium.

[Polishing Rate (Polishing Speed): RR (Removal Rate)]

Polishing speed was measured when an object to be polished (wafer attached with silicon oxide film) was polished by using each polishing composition obtained above at the following conditions.

(Conditions for Polishing)
Polishing apparatus: Mirra-200 mm polishing apparatus (manufactured by Applied Materials: AMAT)
Polishing pad: polyurethane pad (IC1010: manufactured by Rohm and Haas)
Pressure: 1.5 psi
Platen (table) rotation number: 60 rpm
Head (carrier) rotation number: 60 rpm
Flow rate of polishing composition: 200 ml/min
Polishing time: 60 sec (Method for Calculating Polishing Rate)
Polishing rate (polishing speed) was calculated based on the following equation.

[Equation 1]
$$\text{Polishing rate [Å/min]} = \frac{\text{Film thickness before polishing [Å]} - \text{Film thickness after polishing [Å]}}{\text{Polishing time [min]}}$$

The film thickness was obtained by using a light interference type film thickness measurement system (model number; ASET manufactured by KLA-Tencor), and the evaluation was made by dividing the difference in film thickness by polishing time. The results of measuring the polishing rate (RR) are shown in the following Table 1.

[Particle Size of Surface-Modified Abrasive Grains in Polishing Composition of Examples and Particle Size of Abrasive Grains in Polishing Composition of Comparative Examples]

Particle size (average secondary particle size) of surface-modified abrasive grains in the polishing composition of Examples and abrasive grains in the polishing composition of Comparative examples was measured by using a dynamic light scattering type particle size distribution analyzer: UPA (manufactured by Nikkiso Co., Ltd.). The results are shown in Table 1.

TABLE 1

| | | | | Result | | |
|---|---|---|---|---|---|---|
| | Type of ionic dispersant (additive) | Method for preparation | Number average molecular weight of ionic dispersant (additive) | wafer attached with silicon oxide film RR [Å/min] | Average primary particle size [nm] | Average secondary particle size @UPA [nm] |
| Example 1 | Cation modified polyvinyl alcohol | Added in advance | About 4000 | 688 | 33.4 | 60.8 |
| Example 2 | Anion modified polyvinyl alcohol | Added in advance | About 5000 | 259 | 31.8 | 59.2 |
| Example 3 | Polycarbonic acid ammonium salt | Added in advance | About 3000 | 246 | 32.4 | 60.2 |
| Example 4 | Polyacrylic acid ammonium | Added in advance | About 10000 | 274 | 33.4 | 58.7 |
| Example 5 | Quaternary ammonium salt-based polymer | Added in advance | About 5000 | 553 | 32.1 | 59.2 |
| Comparative Example 1 | — | — | — | 188 | 31.8 | 59.3 |
| Comparative Example 2 | Not modified | — | — | *1 | — | — |
| Comparative Example 3 | Cation modified polyvinyl alcohol | Simultaneously added | About 4000 | 162 | 82.1 | 121.4 |
| Comparative Example 4 | Polyacrylic acid ammonium | Simultaneously added | About 10000 | 201 | 77.3 | 98.1 |

*1 For precipitation of the adhesive grains, evaluation of polishing performance was not carried out.

Cation modified polyvinyl alcohol (amino group modified PVA): GOHSENX K434 (registered trademark), manufactured by The Nippon Synthetic Chemical Industry Co., Ltd.

Anion modified polyvinyl alcohol (sulfonic acid modified PVA): GOHSENX L-3266, manufactured by The Nippon Synthetic Chemical Industry Co., Ltd.

Polycarbonic acid ammonium salt: SN Dispersant 5027, SAN NOPCO LIMITED

Polyacrylic acid ammonium: SN Dispersant 5468, SAN NOPCO LIMITED

Quaternary ammonium salt-based polymer: SN Dispersant 4215, SAN NOPCO LIMITED

Discussions

As it is evident from Table 1, since the surface-modified abrasive grains in which an ionic dispersant is directly modified on the surface of the abrasive grains are used for the polishing composition of Examples 1 to 5, it is shown that precipitation of the abrasive grains was suppressed and the object to be polished (wafer attached with silicon oxide film) can be polished at high speed.

On the contrary, the conventionally used polishing composition in which silica immobilized with sulfonic acid is used (Comparative Example 1) showed no precipitation due to suitable dispersion of silica immobilized with sulfonic acid, but the polishing rate was not enhanced compared to Examples 1 to 5.

Furthermore, as there was no surface treatment performed for the abrasive grains of Comparative Example 2, the abrasive grains were aggregated with one another and the abrasive grains precipitated in slurry so that it was impossible to perform the evaluation of polishing performance.

Furthermore, in Comparative examples 3 and 4, it is considered that surface of each abrasive grain is not directly modified with an ionic dispersant and an ionic dispersant is adhered near an aggregate of the abrasive grains, and thus suitable dispersion of the abrasive grains was not achieved. It is believed that, for that reason, the polishing rate cannot be enhanced compared to Examples 1 to 5.

As described above, according to the unique constitution of the present invention, that is, a polishing composition used for polishing an object to be polished in which the polishing composition contains surface-modified abrasive grains where an ionic dispersant is directly modified on the surface of the abrasive grains, and a dispersing medium, and, in the dispersing medium, aggregation of the abrasive grains is suppressed, it becomes possible to meet the requirement of having polishing at higher speed that cannot be achieved by a polishing composition using abrasive grains immobilized with an organic acid like sulfonic acid and carbonic acid.

Furthermore, the unique constitution of the present invention (ionic dispersant is directly modified on the surface of the abrasive grains) is significantly different from the constitution in which anionic dispersant is simply contained in a polishing composition, and the requirement of having polishing an object to be polished at high speed cannot be satisfied by the latter constitution.

The present invention is characterized in that conventional abrasive grains that are immobilized with an organic acid like sulfonic acid and carbonic acid are not used, and abrasive grains of which surface is purposely directly modified with those used as a dispersant are used. By doing so, compared to a case in which conventional abrasive grains that are immobilized with an organic acid like sulfonic acid and carbonic acid are used, polishing rate can be enhanced, although the mechanism remains unclear as described in the above.

Furthermore, compared to a case in which abrasive grains that are immobilized with an organic acid like sulfonic acid and carbonic acid are used, there are effects that cost can be suppressed at low level and the desired abrasive grains can be freely designed. It can be said that the present invention is also very excellent from this point of view.

This application is based upon the Japanese Patent Application No. 2015-192418, Japanese Patent Application No. 2015-192420, and Japanese Patent Application No. 2015-192421 filed on Sep. 30, 2015, and the entire disclosed contents of which are incorporated herein by reference.

The invention claimed is:

1. A polishing composition used for polishing an object to be polished, the polishing composition comprising:
   surface-modified abrasive grains in which an ionic dispersant is directly modified on a surface of the abrasive grains; and
   a dispersing medium,
   wherein, in the dispersing medium, aggregation of the abrasive grains is suppressed.

2. The polishing composition according to claim 1, wherein the ionic dispersant is polyvinyl alcohol or a derivative thereof.

3. The polishing composition according to claim 2, wherein the polyvinyl alcohol or a derivative thereof is a cation modified polyvinyl alcohol or a derivative thereof.

4. The polishing composition according to claim 1, wherein the object to be polished is an object to be polished which has a silicon-oxygen bond, an object to be polished which has a silicon-silicon bond, or an object to be polished which has a silicon-nitrogen bond.

5. The polishing composition according to claim 4, wherein the object to be polished is an object to be polished which has a silicon-oxygen bond.

6. The polishing composition according to claim 1, further comprising a pH adjusting agent.

7. The polishing composition according to claim 1, wherein the polishing composition has pH of from 2 to 5.

8. A method for producing a polishing composition used for polishing an object to be polished, the method comprising mixing surface-modified abrasive grains in which an ionic dispersant is directly modified on a surface of the abrasive grains with a dispersing medium.

9. The method for producing the polishing composition according to claim 8, wherein the surface-modified abrasive grains are produced by comprising:
   a first step of preparing an abrasive grain dispersion liquid containing the abrasive grains,
   a second step of adjusting the abrasive grain dispersion liquid to have pH of from 7 to 9 to produce a pH adjusted dispersion liquid, and
   a third step of mixing the pH adjusted dispersion liquid with the ionic dispersant.

10. The method for producing the polishing composition according to claim 9, wherein the third step is carried out by stirring at 10 to 60° C.

11. A method for polishing an object to be polished by using the polishing composition according to claim 1.

* * * * *